US005586187A

United States Patent [19]

Webb

[11] Patent Number: 5,586,187

[45] Date of Patent: Dec. 17, 1996

[54] AUTOMOTIVE SOUND REPLICATOR

[76] Inventor: James D. Webb, 129 Lake Shore Dr., Pasadena, Md. 21122

[21] Appl. No.: 266,335

[22] Filed: Jul. 1, 1994

[51] Int. Cl.[6] .......... H03G 3/00

[52] U.S. Cl. .......... 381/61; 381/86; 395/279; 395/2.81

[58] Field of Search .......... 381/61, 86; 360/12; 369/174; 364/424.03, 424.04; 379/2, 2.1, 2.79, 2.81, 3.81

[56] References Cited

U.S. PATENT DOCUMENTS

| | | | |
|---|---|---|---|
| 4,179,584 | 12/1979 | Tanimoto et al. | 395/2.79 |
| 5,056,145 | 10/1991 | Yamamoto et al. | 395/2.79 |
| 5,237,617 | 8/1993 | Miller | 381/61 |
| 5,317,671 | 5/1994 | Baker et al. | 395/2 |
| 5,359,698 | 10/1994 | Goldberg et al. | 395/2.1 |
| 5,402,518 | 3/1995 | Lowery | 395/2.1 |

FOREIGN PATENT DOCUMENTS

| | | | |
|---|---|---|---|
| 4207447 | 9/1993 | Germany | 395/2 |
| 4-152395 | 5/1992 | Japan | 381/61 |

OTHER PUBLICATIONS

An Introduction to Microcomputers: vol. II, Some Real Products. 1976, Adam Osborne and Associates, Inc., pp. 6–13.

*Primary Examiner*—Curtis Kuntz
*Assistant Examiner*—Xu Mei
*Attorney, Agent, or Firm*—Robert E. Bushnell, Esq.

[57] ABSTRACT

A hand-held automotive sound replicator having a case provided with a keyboard, a speaker and a power switch. The case houses a microprocessor responsive to a key input signal from the keyboard for providing data indicative of the key input signal for accessing a programmable read only memory via a random access memory. The programmable read only memory provides program and sound files to be stored in a microprocessor via the random access memory and through a controller. The microprocessor outputs digital sound signals to a digital-to-analog convertor, which provides an analog signal to a sound generator. The output from the sound generator is regulated by a volume control through an amplifier to the speaker.

14 Claims, 2 Drawing Sheets

AUTOMOTIVE SOUND REPLICATOR

BACKGROUND OF THE INVENTION

1. Field of the Invention

This invention relates to a sound replicator and particularly, a sound replicator used as an aid in describing automotive sounds caused by defects in an automobile, and more particularly a hand-held sound replicator used as an aid in repairing an automobile by aiding the owner in describing to a service technician one or more noises made by the automobile as will be determined by the disclosure if the preferred embodiments and appended claims.

A common problem a service technician encounters in repair of automobiles is the owner attempting to describe a particularly new, unwanted, and maybe intermittent sound the automobile is making, wherein such a sound is similar to other sounds and could be caused by any number of defects or components in the automobile. Further it is nearly impossible for a person to orally duplicate and differentiate some of the sounds heard and some of these sounds aren't made continuously, thus requiring the service technician to take time and test drive the automobile.

Some sounds are hard to differentiate between, for example, one would find it hard to duplicate a tapping sound as compared to a knocking, pinging, clicking or rattling sound. A further example would be in trying to differentiate and duplicate a squeal as compared to squeak.

2. Description of the Prior Art

Sound generation art has many different applications, such as in games or toys in duplication desired sound effects as disclosed in U.S. Pat. Nos. 3,425,156, 3,591,911, or 5,184,830. Additionally, sound generators are used to duplicate sounds and are used for educational or training purposes, such as disclosed in U.S. Pat. Nos. 1,930,286, 3,845,572 or 4,932,880. Other types of sound generators are disclosed for example in U.S. Pat. Nos. 3,578,912 or 4,393,373.

SUMMARY OF THE INVENTION

Accordingly, it is a general object of the present invention to provide a device which accurately duplicates sounds produced by an automobile.

It is a further object of the present invention to provide a hand-held device which is simple in design and operation for duplicating sounds produced by various components of an automobile.

In accordance with these objectives, the present invention is comprised of a hand-held device a case provided with a keyboard, a speaker and a power switch. The case houses a microprocessor responsive to a key input signal from the keyboard for providing data indicative of the key input signal for accessing a random access memory and for accessing a programmable read only memory via the random access memory. The programmable read only memory provides program and sound files to be stored in a microprocessor via the random access memory and through a controller. The microprocessor outputs digital sound signals to a digital-to-analog convertor, which provides an analog signal to a sound generator. The output from the sound generator is regulated by a volume control and output through an amplifier to the speaker.

These and further objects, features, and advantages of the present invention will become more apparent from the following description when taken in connection with the accompanying drawings which show, for the purpose of illustration only, preferred embodiment(s) in accordance with the present invention, with like numerals indicating corresponding parts throughout.

BRIEF DESCRIPTION OF THE DRAWINGS

Referring now to the drawings.

It is appreciated that these and other modifications to the inventive concepts may be apparent to those of ordinary skill in the art without departing from the spirit and scope of the invention.

DETAILED DESCRIPTION OF THE DRAWINGS

Figure 1:
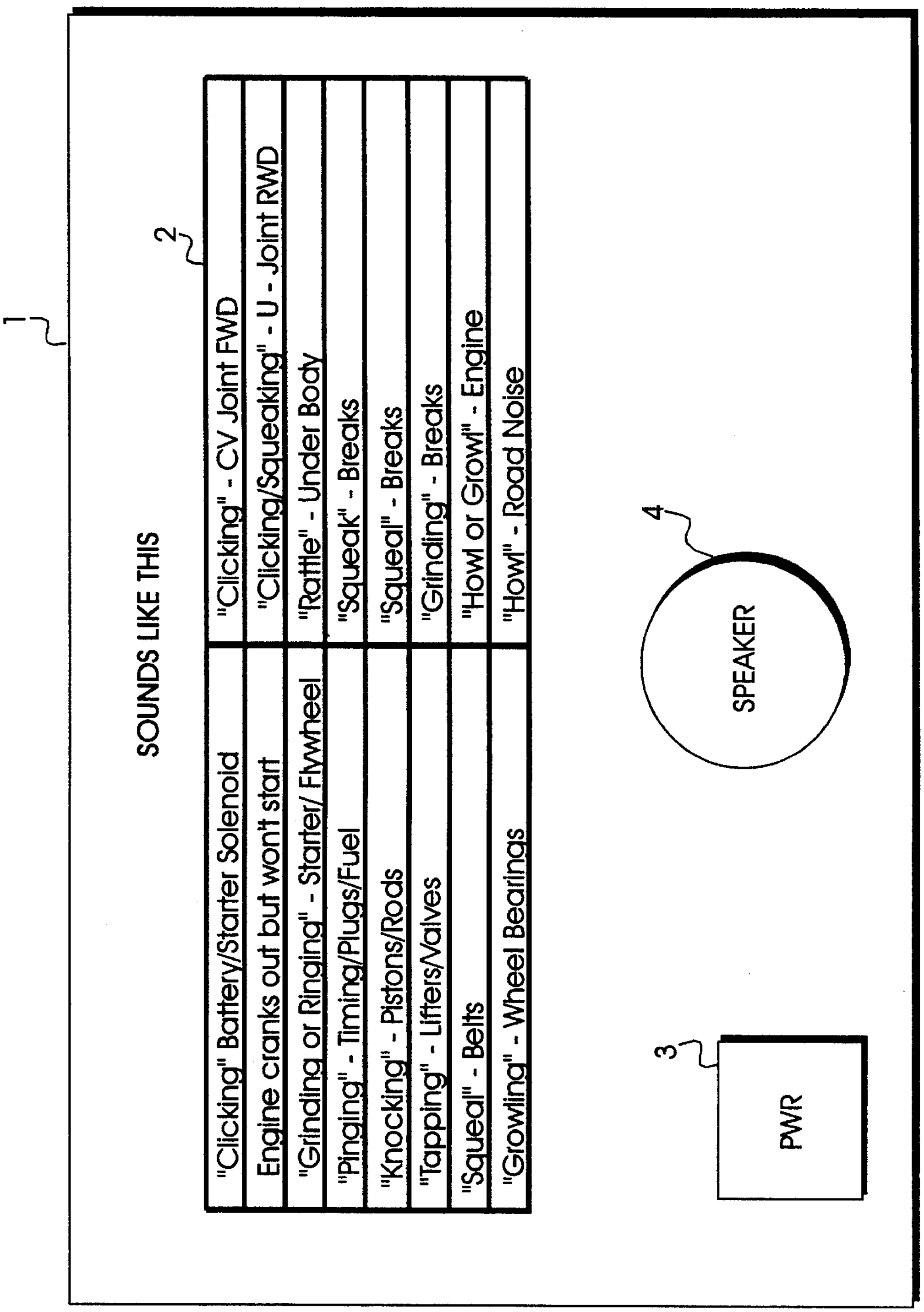
FIG. 1 is a front view of an exterior housing of the present invention.

FIG. 1 is an example of a preferred embodiment of the present invention depicting the hand-held vehicular sound replicator and preferably a hand-held automotive sound replicator. This sound replicator includes a case 1 which is provided with at least a keyboard 2 having a plurality of keys representing several automotive components capable of emitting sounds and/or noise characteristic of such components during normal or abnormal conditions, wherein abnormal conditions usually indicate a need for repair, and a speaker 4 for audibly outputting sound in response to selection of one of the keys.

Figure 2:
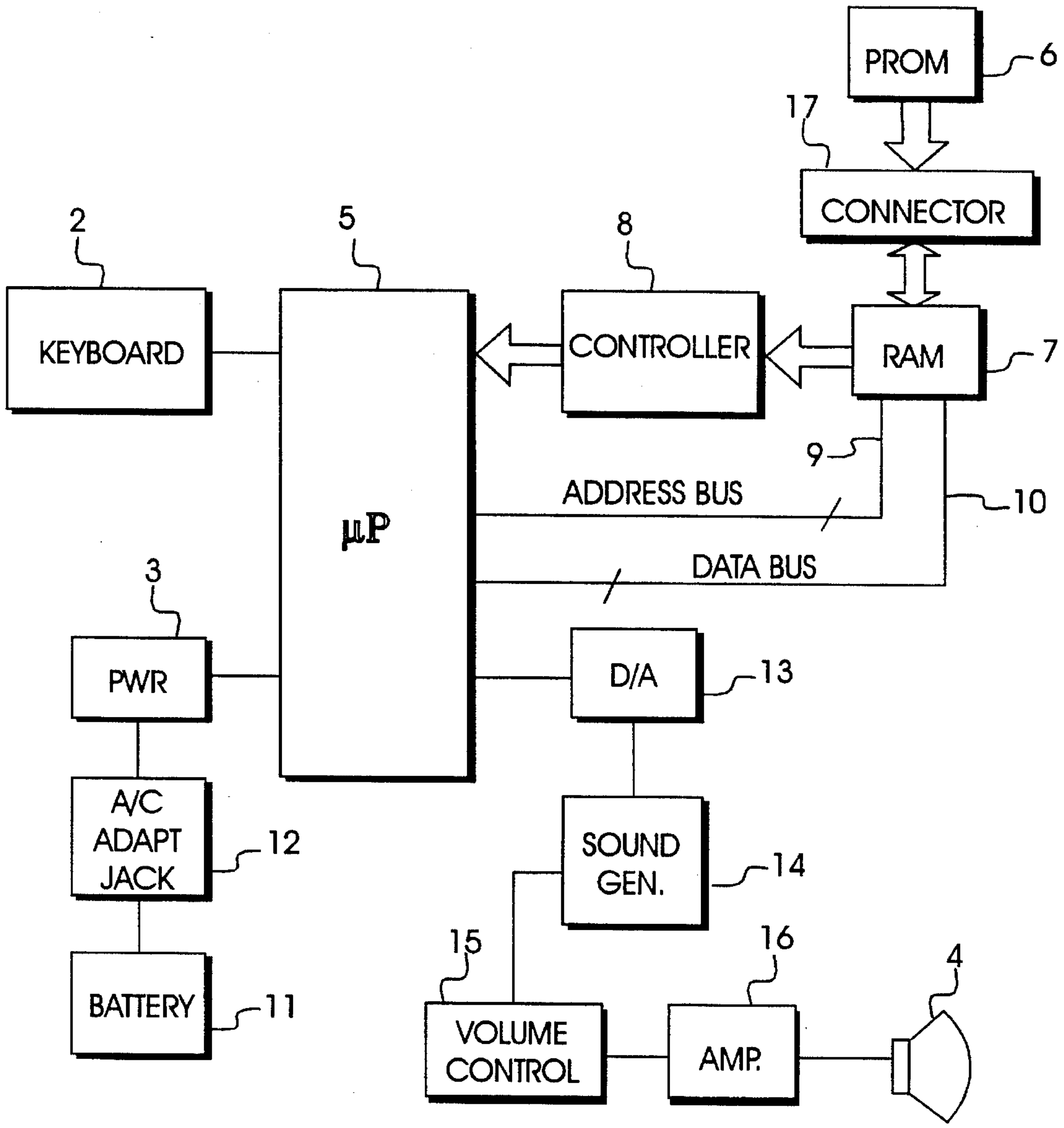
FIG. 2 is block diagram showing the electronic components of the invention.

Referring to FIG. 2, the above described keyboard 2 is connected to provide key input signals to a microprocessor 5, which may be of a commercially available type. When the sound replicator is turned on, the microprocessor 5 outputs a first control signal to a RAM 7 via a data bus 10. RAM 7 provides basic digital data and addresses data to the microprocessor 5 so that predetermined sounds can be generated by the sound replicator. When PROM 6 is connected to RAM 7, RAM 7 accesses PROM 6 for controlling the PROM 6 to output program and sound files. RAM 7 provides the program and sound files to the microcomputer 5 through controller 8, and outputs address data to the microprocessor 5 via an address bus 9 in order to temporarily store the program and sound files in an internal memory (not shown) so that the sound replicator can reproduce specific sounds for the automobile. In order to generate other sounds for different types of vehicles, PROM 6 will be programmed to provide program and sound data corresponding to the particular vehicle being scrutinized.

The microprocessor 5 provides a second control signal via data bus 10 to RAM 7 in response to a key input signal from keyboard 2, the second control signal being indicative of which key was activated in order to provide the key input signal. RAM 7 then provides address data, in response to the second control signal, via the address bus 9 to the internal memory for addressing a desired sound file in which digital sound data is stored. The internal memory outputs digital sound data to a sound generator 14 via a digital-to-analog convertor 13. Sound generator 14 generates a sound signal and provides the sound signal to an amplifier 16 via volume control 15, the output of the amplifier 16 is then provided to speaker 4.

RAM 7 further provides instructions to controller 8 so that controller 8 generates read and write control signals for controlling the reading of data from the internal memory or the writing of data to the internal memory.

Further, shown in FIG. 2 are the interconnections of a battery 11, A/C adaptor jack 12 and the power switch 3. The sound replicator will operate in response to dc voltage from battery 11 or from an A/C adapter when an A/C adaptor is connected to jack 12.

The following table provides an example of how the keys may be labelled indicating several components of the automobile and/or the sounds each of the components make.

TABLE 1

| Button | Label |
|---|---|
| A | "Clicking"-Battery/Starter Solenoid |
| B | Engine cranks but won't start |
| C | "Grinding or Ringing"-Starter/Flywheel |
| D | "Pinging"-Timing/Plugs/Fuel |
| E | "Knocking"-Pistons/Rods |
| F | "Tapping"-Lifters/Valves |
| G | "Squeal"-Belts |
| H | "Growling"-Wheel Bearings |
| I | "Clicking"-CV Joint FWD |
| J | "Clicking/Squeaking"-U-Joint RWD |
| K | "Rattle"-Under Body |
| L | "Squeak"-Brakes |
| M | "Squeal"-Brakes |
| N | "Grinding"-Brakes |
| O | "Howl or Growl"-Engine |
| P | "Howl"-Road noise |

In operation, the user will select one of the keys on the keyboard 2 which best relates to the problem or sound heard and the sound will be output through speaker 4. However, as can be seen from the foregoing table, the user may need to listen to several different replicated sounds in order to determine, by a trial-and-error process, the closest replication of the sound heard in the automobile.

The following list provides examples of specific components which could be causing the noise/sound being replicated corresponding to the foregoing table, and therefore, should be checked in the automobile.

| A "Clicking"-Battery/Starter Solenoid: | |
|---|---|
| Check: | a. Battery voltage |
| | b. Alternator output |
| | c. starter draw |
| | d. Starter solenoid |
| | e. Battery terminals |
| | f. Starter cables |
| | g. Engine grounds |

(1) This "clicking" type sound can occur when trying to start the engine. When a vehicle has battery terminal that are "dirty" this happens. The word "Dirty" can be a literal form, whereas white, crusty, acid power, clumps up at he terminals. "Dirty terminals" can also be invisible. The reasons you can't see the "dirt" or point of resistance, is because is directly between the contact points, and does not go beyond the point where it would become visible, in place. The contacts must be removed from their normal position in order to inspect them completely, visibly. To test in place, an ohmmeter can be used to determine resistance, but a volt/amp meter would be more useful to test voltage drop, and amperage flow;

(2) This "Clicking" type sound is one produced by a vehicle with low battery voltage. When the key is turned to the start position, the starter attempts to pull the electromagnetic solenoid into the drive gear. Without enough voltage the solenoid can not overthrow the return spring tension. Therefore causing the starter solenoid to kick out toward engaging the drive gear and being pulled back by the return spring, causing a rapid millisecond/Tic-Tic-Tic-Tic- etc; or (3) With full battery voltage, if the starter solenoid is defective, a "clicking" type sound occurs because the electromagnetic field produced, is not strong enough to overthrow the return spring tension/pressure. This is usually due to poor electrical internal contacts, from wear and corrosion, causing excessive resistance. Therefore full voltage does not apply at the solenoid field coil.

| B Engine cranks but won't start | |
|---|---|
| Check: | a. Fuel gauge reading |
| | b. Ignition spark at the plugs |
| | c. Fuel pressure/flow |
| | d. Power supply to fuel pump/if electric |
| | e. Compression |
| | f. Possible primary ignition shorted to ground |
| | g. Timing belt or timing chain |

This sound is one that is produced by an engine spinning, but not starting. This is referred to as "cranking". This happens when a vehicle has full battery power turning the engine over, but not completing the starting process. This is usually due to the lack of ignition power/spark, fuel pressure, or mechanical timing problem, such as a broken timing belt, timing chain, distributor gear, etc..

| C "Grinding or Ringing"-Starter/Flywheel | |
|---|---|
| Check: | a. Starter teeth |
| | b. Flywheel teeth |
| | c. Starter drive |

This "Ringing" or grinding type sound occurs when a poor starter to flywheel contact happens (during start-up). The starter solenoid engages the drive gear of the starter. The starter drive gear spins as it should, but is not turning the engine, or flywheel. This condition occurs because the teeth of the flywheel are burred, chipped, or completely missing. This is usually a result if a previous starter to flywheel incorrect contact clearance. It can also be result of a bent, or cracked flywheel.

| D "Pinging"-Timing/Plugs/Fuel | |
|---|---|
| Check: | a. Ignition timing per factory specifications |
| | b. EGR operation |
| | c. Octane level |
| | d. Valve clearance |

This "pinging" or sometimes referred to as knocking sound occurs while driving. It is especially noticed during acceleration or going up hills. This sound is the fuel in the engine igniting too soon in the combustion chamber, (in the cylinder). When the fuel flashes off before the piston gas reached the top of the cylinder wall. This causes the explosion to go off too soon, therefore making a "pinging" or knocking type sound. This is usually due to the ignition timing set too far advanced, (before top dead center), low octane fuel, fuel with either content, or engine running too hot.

| E "Knocking"-Pistons/Rods | |
|---|---|
| Check: | a. Oil level |
| | b. Use sound pinpointing device (e.g. 3' length of ⅝" heater hose) |
| | c. Remove spark plug wires one at a time to check for difference in sound |
| | d. Be sure knock is not confused with pinging |
| | e. Inspect mechanical parts as necessary |

This "Knocking" or tapping type sound occurs whenever the engine is running. The vehicle dies not need to move but will occur also when moving. It usually occurs at a certain RPM, mostly revved up about 2,000 Rpm's, not as often at idle. This knock type sound is produced when excessive clearance between the connecting rod bearing and the crankshaft exist. The improper, or extra clearance, has a hammering effect between the two metal parts as they are going up and down. When this happens the engine is self-destructing. This condition is usually a result from lack of lubrication. This lack of lubrication of the metal parts can occur from lack of oil content, volume, flow restriction, pressure loss, etc. This knock sound can also be produced by a broken piston, resulting from over revving Rpm's, or metal stress/fatigue. This is a lower half of the engine problem. i.e. below cylinder head.

| F "Tapping"-Lifters/Valves | |
|---|---|
| Check: | a. Oil level |
| | b. Use sound pinpointing device |
| | c. Valve clearance |
| | d. Be sure tapping is not confused with knock |
| | e. Rockers |
| | e. Lifters |
| | f. Camshaft |

This "tapping" type sound occurs when the engine is running with or without vehicle moving. This sound is produced by excessive clearance at the valve rocker/lifter. This sound of a valve tap is close to, but different from that of a knock. It has a higher pitch or frequency. It is more noticeable at an idle or a higher pitch or frequency. It is more noticeable at an idle or low Rmp.'s. The sound is produced by too much clearance between the camshaft lobe and the valve rocker. It can also be noise from a collapsed lifter internal spring. This noise is not as life threatening to the engine as a "rod Knock" but should be inspected for need of repair. This sound is usually a result of valves that need to be adjusted, lifters, or camshaft in need of replacement. Also note that a low frequency "valve tap" type noise occurs when a fuel injected engines. This can be a specific vehicle experience can best determine the difference between wheat is normal, and what is not normal.

| G "Squeal"-Belts | |
|---|---|
| Check: | a. Fan belts - material and tightness |
| | b. Idler pulleys |
| | c. Water pump |
| | d. Alternator bearings |
| | e. Power steering pump |
| | e. Air pump |
| | f A/C compressor |

This "Squealing" type sound occurs mostly upon starting the engine. It can also occur when accelerating, or turning the steel wheel. The noise occurs when a runner drive belt is slipping across a metal pulley. It will occur more frequently when the engine is cold, due to the fact the rubber has not yet heated up to a larger diameter, or a tacky surface texture. It is a result of excessive clearance between the belt and pulley, or water pump, idler bearing, a/c compressor, etc., it is necessary to inspect drive belts tension, and driven pulleys for binding.

| H "Growling"-Wheel Bearings | |
|---|---|
| Check: | a. Wheel bearing |
| | b. Tires for ripples |
| | c. Idler bearings |
| | d. Front end alignment |

This "Growling" or groaning type noise only occurs when the vehicle is in motion. Driving at higher speeds it is almost always louder, than at lower road speeds. This noise occurs when a worn wheel bearing surface is pitted or dry. The rough and/or dry surface of a roller type or ball bearing type wheel nearing is rubbing against another rough or dry metal surface. When the two rough surface rub together as they are rolling around they produce the "Howling" or groaning. This condition starts off quiet and becomes louder as the problem worsens. The wheel bearings wear out as a result of lack of grease type lubrication, heat, and accident damage. Note many vehicles are equipped with sealed bearings which cannot be greased as a maintenance. These sealed type wheel bearings usually have a life expectancy of 50 to 100 thousand miles or more, but can fail sooner due to extreme conditions such as extreme heat, rough roads, and impact damage.

| I "Clicking"-CV Joint FWD | |
|---|---|
| Check: | a. Constant velocity (C/V) boots |
| | b. C/V Joints |
| | c. Wheel bearings |
| | d. Brake springs |

This "Clicking" type sound only pertains to front wheel drive and 4 wheel drive vehicles. This noise mostly occurs when going around turns, or starting to move from a stop. The "Clickity" sound is that of the from drive axile. The constant velocity joint has ball bearings which ride against a grooved flex joint. When the two metal surfaces are dry, or have too much clearance they are twisting with a hammering force. The clearances will become larger and louder eventfully breaking the constant velocity joint of the drive axle. When the c/v joint breaks, the vehicle stops moving. Usually a banging type noise will then occur, vehicle not in motion, but the speedometer moving. The reason for most c/v joint failures is a tom grease boot. The grease boots should be checked at every oil change, especially after 50,000 miles. Early detection and replacement of a grease boot will often save the c/v joint from failure. Note-c/v joint can also just plain wear out after 100,000–200,000 miles, from the driving force.

| J "Clicking/Squeaking"-U-Joint RWD | |
|---|---|
| Check: | a. Universal joints |
| | b. Drive shaft yokes |
| | c. Support bearings |
| | d. Transmission tail shaft bushing |

This "Clicking" or "Squeaking" type sound only pertains to rear wheel drive, or 4 wheel drive vehicles. It will only occur when the vehicle is in motion, especially moving from a stopped position, or a slow rolling turn. The noise is produced by dry metal surfaces and or excessive clearances in the universal joint. When the roller type bearing become dry of grease lubrication the rollers disintegrate to power from the driving force and then cause excessive clearance. The extra clearance has a hammering effect which breaks the universal joint. At this point the drive shaft usually fills out from under the vehicle and stops motion. Some vehicles are equipped with a catching device known as a drive shaft loop. Sealed U/joints are common, and usually long lasting. Heavy loads, and jack rabbit starts, shorten universal joint life. Universal joints that are not sealed require periodic maintenance, such as grease fittings.

| K "Rattle"-Under Body | |
|---|---|
| Check: | a. Exhaust system<br>b. Motor mounts<br>c. Transmission mounts<br>d. Exhaust system routing<br>e. Front suspension<br>f. Rear suspension |

This "rattling" type sound occurs with the engine running, with or without the vehicle in motion. Usually happens more often in gear, at a stop, or over bumps. Sometimes can be felt vibrating the floorboard of the vehicle. Noise is generated by a vibrating the floorboard of the vehicle. Noise is generated by a tinny metal rubbing, or banging against the vehicle body of frames. Adjusting exhaust pipes for proper clearance will stop such a noise. Also, broken motor or transmission mount, will cause the properly clearing pipes to shift over against the body frame. Mounts should be checked for breakage. All exhaust systems should be insulated from vibration to the body or frame by means of rubber between pipes/hangers and body/frame.

| L "Squeak"-Brakes | |
|---|---|
| Check: | a. Brake linings<br>b. Brakes rotors and drums<br>c. Brake calipers wheel cylinders<br>d. Wheel bearings<br>e. Brake hoses and steel lines<br>f. If inspection is ok, may be normal |

This "Squealing" or low squeal type sound only happens with the vehicle in motion. Usually upon light braking, at speeds. The noise is generated by a common, glassy type glaze at the friction surface of the brake pads, rubbing against a glassy type glazed surface of the brake rotor. This noise is louder with certain types of pad/lining materials, such as semi-metallic lining. These type pad/lining have small amounts of metal composite molded into them. This produces a faster stopping effect and shorter stopping distances. The drawback although is a metal to metallic lining friction surface which often creates annoying noises. A slight in most cases is a normal condition. It is recommended that linings be checked for abnormal wear. If the wear patterns are normal, the choices are, to adapt to the noise, or change the material of the pad/linings. Note-doing so may increase stopping distance of said vehicle.

-continued

| M "Squeal"-Brakes | |
|---|---|
| Check: | a. Brake linings<br>b. Brake rotors and drums<br>c. Brake calipers wheel cylinders<br>d. Wheel bearings<br>e. Brake hoses and steel lines |

This "Squealing" type sound will usually be loud and will only occur with the vehicle in motion. It usually happens more often upon light breaking. It can also be described as a loud "Screech". This noise is created by a device known as wear indicator. This device consists of a thin tinny metal which is pointed directly at a 90 degree angle toward the brake rotor, but attached to the brake pad. As the brake pad wears down the wars indicator touches against the brake rotor, causing a rapid tinny metal vibration, therefore making a loud screeching type sound/noise. Brake linings should checked for wear and repaired as necessary. Early detection can save from costly repairs as the brake rotor usually can be saved from ruin. For said reason, wear indicator should ne reused, or replaced and not discarded.

| N "Grinding"-Brakes | |
|---|---|
| Check: | a. Brake linings<br>b. Brake rotors and drums<br>c. Brake calipers wheel cylinders<br>d. Wheel bearings<br>e. Brake hoses and steel lines |

This "Grinding" type sound happens only while the vehicle is in motion. Happens more often during hard braking, but also during light braking, and sometimes when not braking at all, at a quieter level. This noise is created by a worn out brake pad.lining grinding metal against metal. This is when the normal friction surface of the pad/lining has worn off and now is just the backing plate of the pad grinding the brake rotor to ruin. If ignored, the brake rotor will grind completely detaching form the center hub portion from the friction surface. When the center hub portion is separated from the friction surface of the rotor there is NO stopping power.

| O "Howl or Growl"-Engine | |
|---|---|
| Check: | a. Water pump<br>b. Idler bearings<br>c. Power steering pump<br>d. A/C compressor clutch bearing<br>e. Air pump<br>f. Timing belt idler<br>g. A/C compressor<br>h. Fan clutch<br>i. Fan blade clearance<br>j. Motor mounts |

This "Growling" or "Howling" noise occurs whenever the engine is running, the vehicle need not be in motion. This usually happens more often with a cold engine, but can also happen when engine is hot. It is usually most noticeable when vehicle is stopped, and engine is at an idle. Water pump bushings, idler bearings, alternator, generator bearings, tend to lock-up after sitting. Running the engine can sometimes loosen them up a bit. Therefore a cold engine condition is more likely to make a water pump bushing, or idler bearing noise more prominent. A 3 to 4 foot length of ⅝ heater hose can be used to isolate the sound. Note-keep hose and body parts clear of the moving engine parts.

| P "Howl"-Road noise | |
|---|---|
| Check: | a. Wheel bearings<br>b. Tires for ripples<br>c. Idler bearings<br>d. Axle bearings<br>e. Front suspension<br>f. Rear suspension<br>g. Brake linings |

This "Howling" type sound only occurs while the vehicle is in motion. The faster the vehicle speed, the louder the sound is. This noise is produced by rippled tires rolling across a smooth road surface. Rippled tire are ones that have wear, that look like that of an ocean wave. To rob your hand across the outer tread of the tire, you can feel the bumpy texture. The sound produced is similar to one of a bad wheel bearing. The difference can be found by a visual inspection of the vehicle tires. This cause of this wear is, improper from end alignment, worn out shocks, and/or front end parts. 4 wheel drive vehicles commonly have this howling sound due to tippled tires. Reason being, 4 wheel drives have more from axle weight, a greater drag coefficient, and a harder side scuffing on turns. This rippled tire wear also applies to the rear tires, mostly on front wheel drive vehicles. Whereas the rear wheels are out of alignment and/or rear shocks are worn out. Rippled tire noise almost always is associated with a vibration from the wheels, felt by the driver, through the body, or at the steering wheel. Worn out shocks allow the tires to bounce up and down erratically against the road surface, there fore causing uneven, rippled tire wear.

It should be understood that the sounds made by an automobile are recorded on tape and then converted to digital data to be stored in PROM 6. Accordingly, it may be desired to provide sound information from a tape recorder via a digital-to-analog convertor to the RAM 7. In such a case, RAM 7 would address the tape recorder by use of a cue signal, wherein the respective sounds stored on the tape would be separated and addressable by corresponding cue signals. Also, it may be desired to use a floppy disk to provide the sound data. Additionally, it may be desired to be able to provide sound data selectively from PROM 6, a tape recorder or a floppy disk and as such, a mode switch would be provided on the case 1 in order to effectively select the desired input device. Further, it may be desired to provide a display on the case 1, wherein the keys would be labelled only with a description of the sound to be generated and in response to key activation, the display would provide an image of the part making the generated noise. It is appreciated that these and other modifications to the inventive concepts may be apparent to those of ordinary skill in the art without departing from the spirit and scope of the invention.

I claim:

1. An apparatus for replicating a plurality of sounds produced by vehicular components, comprising:

a keyboard having a plurality of keys, each of said keys identifying a respective one of said plurality of sounds;

microprocessing means for receiving a key input signal generated by activation of one of said keys, for generating first control data in response to receipt of a power supply voltage from a source of power supply, and for generating second control data in response to receipt of said key input signal;

random access memory means for receiving said first and second control data from said microprocessor means;

said random access memory means providing first digital data and first address data to said microprocessor means in response to said first control data;

said random access memory means outputting a control signal in response to said second control data;

programmable read only memory means having stored sound information for providing said sound information to said random access memory means;

said random access memory means providing said sound information and second address data to said microprocessor means for storage in said microprocessor means;

said microprocessing means for providing digital sound data to a digital-to-analog converter in response to said key input signal said digital-to-analog converter converting said digital sound data to an analog signal; and sound generating means receiving said analog signal for generating a sound signal.

2. The apparatus as set forth in claim 1, said microprocessing means comprising:

a controller for receiving said sound information from said random access memory means, and for generating read and write control signals in response to said control signal output by said random access memory means; and a microprocessor for receiving said sound information from said controller, for receiving said write control signal for controlling storage of said sound information in said microprocessor, for receiving said read control signal for controlling said microprocessor to output said digital sound data, and said first and second address data from said random access memory means for addressing memory locations in said microprocessor for storing said sound information and for outputting said digital sound data.

3. The apparatus as set forth in claim 1, wherein said sound information comprises sound files and program data, said sound files comprising said digital sound data.

4. The apparatus as set forth in claim 2, wherein said sound information comprises sound files and program data, said sound files comprising said digital sound data.

5. The apparatus as set forth in claim 1, further comprising connecting means for connecting said programmable read only memory means to said random access memory means.

6. The apparatus as set forth in claim 1, said sound generating means comprising:

a sound generator for receiving said analog signal from said digital-to-analog converter and for generating an analog sound signal;

an amplifier for amplifying said analog sound signal for outputting an amplified signal;

volume control means connected between said sound generator and said amplifier for controlling the level of said analog sound signal applied to said amplifier; and a speaker for outputting said sound signal in response to said amplified signal.

7. The apparatus as set forth in claim 2, said sound generating means comprising:

a sound generator for receiving said analog signal from said digital-to-analog converter and for generating an analog sound signal;

an amplifier for amplifying said analog sound signal for outputting an amplified signal;

volume control means connected between said sound generator and said amplifier for controlling the level of said analog sound signal applied to said amplifier; and a speaker for outputting said sound signal in response to said amplified signal.

8. The apparatus as set forth in claim 6, said microprocessing means comprising:

a controller for receiving said sound information from said random access memory means, and for generating read and write control signals in response to said control signal output by said random access memory means; and a microprocessor for receiving said sound information from said controller, for receiving said write control signal for controlling storage of said sound information in said microprocessor, for receiving said read control signal for controlling said microprocessor to output said digital sound data, and said first and second address data from said random access memory means for addressing memory locations in said microprocessor for storing said sound information and for outputting said digital sound data.

9. The apparatus as set forth in claim 1, wherein said vehicular components are components of an automobile and said plurality of sounds are indicative of noise made by each of said components of said automobile.

10. A method for replicating a plurality of distinctively audiably different sounds produced by vehicular components, comprising the steps of:

receiving, at a microprocessor, a key input signal generated by manual activation of one of a plurality of keys, each of said keys identifying a different respective one of said plurality of distinctively audiably different sounds;

outputting, from said microprocessor, first control data in response to receipt of a power supply voltage from a source of a power supply, and outputting second control data in dependence upon receipt of said key input signal, said second control data being distinctively different for each of each of said plurality of keys;

providing first digital data and first address data read from a random access memory to said microprocessor in response to said first control data;

outputting, from said random access memory, an instruction signal in response to said second control data;

providing stored sound information from a programmable read only memory to said random access memory;

providing, from said random access memory, said stored sound information and second address data to said microprocessor for storage in said microprocessor;

storing said sound information as digital sound data in said microprocessor in dependence upon said instruction signal output from said random access memory;

providing digital sound data from said microprocessor to a digital-to-analog converter in response to said key input signal;

converting said digital sound data via said digital-to-analog converter into an analog signal; and generating an audible sound signal representative of said analog signal.

11. The method as set forth in claim 10, wherein said stored sound information comprises sound files and program data, said sound files comprising said digital sound data.

12. The method as set forth in claim 10, with said step of generating a sound signal further comprising the steps of:

converting in a sound generator said analog signal from said digital-to-analog converter into an analog sound signal;

generating an amplified audio frequency signal by amplifying said analog sound signal by an amplifier:

controlling the magnitude of said analog sound signal applied to said amplifier; and broadcasting, over a speaker, said audible sound signal corresponding to said amplified audio frequency signal.

13. An apparatus for replicating a plurality of sounds produced by vehicular components, comprising:

a keyboard having a plurality of keys, a first one of said keys identifying a clicking sound, a second one of said keys identifying a sound of cranking engine, a third one of said keys identifying a grinding/ringing sound, a fourth one of said keys identifying a pinging sound, a fifth one of said keys identifying a knocking sound, a sixth one of said keys identifying a tapping sound, a seventh one of said keys identifying a squeal sound, an eigth one of said keys identifying a growling sound, a ninth one of said keys identifying a squeak sound, and a tenth one of said keys identifying a howl sound;

microprocessing means for receiving a key input signal generated by activation of one of said keys, for generating first control data in response to receipt of a power supply voltage from a source of power supply, and for generating second control data in response to receipt of said key input signal;

first memory means for receiving said first and second control data from said microprocessor means;

said first memory means providing first digital data and first address data to said microprocessor means in response to said first control data;

said first memory means outputting a control signal in response to said second control data;

second memory means having stored sound information for providing said sound information to said first memory means;

said first memory means providing said sound information and second address data to said microprocessor means for storage in said microprocessor means;

said microprocessing means for providing digital sound data to a digital-to-analog converter in response to said key input signal said digital-to-analog converter converting said digital sound data to an analog signal; and sound generating means receiving said analog signal for generating a sound signal.

14. The apparatus as set forth in claim 13, said microprocessing means comprising:

a controller for receiving said sound information from said first memory means, and for generating read and write control signals in response to said control signal output by said first memory means; and a microprocessor for receiving said sound information from said controller, for receiving said write control signal for controlling storage of said sound information in said microprocessor, for receiving said read control signal for controlling said microprocessor to output said digital sound data, and said first and second address data from said first memory means for addressing memory locations in said microprocessor for storing said sound information and for outputting said digital sound data.

* * * * *

UNITED STATES PATENT AND TRADEMARK OFFICE

CERTIFICATE OF CORRECTION

PATENT NO. : 5,586,187

DATED : Dec. 17, 1996

INVENTOR(S) : James D. Webb

It is certified that error appears in the above-indentified patent and that said Letters Patent is hereby corrected as shown below:

Column 3, Line 50, after "battery", change "terminal" to --terminals--;

Line 54, before "you", change "reasons" to --reason--;

Line 55, between "because" and "is" (the second occurrence), insert --it--;

Column 4, Line 46, after "result", change "if" to --of--;

Line 66, after "with", change "either" to --ether--;

Column 5, Line 12, after "vehicle", change "dies" to --does--;

Line 41-42, after "frequency", delete sentence "It is more noticeable at an idle or a higher pitch or frequency";

UNITED STATES PATENT AND TRADEMARK OFFICE

CERTIFICATE OF CORRECTION

PATENT NO. : 5,586,187
DATED : Dec. 17, 1996
INVENTOR(S) : James D. Webb

It is certified that error appears in the above-indentified patent and that said Letters Patent is hereby corrected as shown below:

| | | |
|---|---|---|
| | Line 43, | after "noticeable", change "at an" to --during--; |
| | Line 43, | after "low", change "Rmp.'s" to --RPMs--; |
| | Line 44, | before " from", change "noise" to --noisy--; |
| | Line 51, | between "injected" and "engines", insert --to--; |
| | Line 52, | between "experience" and "can", insert --that--; |
| | Line 52, | after "between", change "wheat" to --what--; |
| | Line 66 | before "wheel", change "steel" to --steering--; |
| | Line 66, | before "drive", change "runner" to --rubber--; |
| Column 6, | Line 10, | in the list of "H", replace "a. Wheel bearing" to --a. Wheel bearings--; |
| | Line 17, | between "louder" and "than", delete --,--; |

UNITED STATES PATENT AND TRADEMARK OFFICE

CERTIFICATE OF CORRECTION

PATENT NO. : 5,586,187
DATED : Dec. 17, 1996
INVENTOR(S) : James D. Webb

It is certified that error appears in the above-indentified patent and that said Letters Patent is hereby corrected as shown below:

| | | |
|---|---|---|
| | Line 19, | after "wheel", change "nearing" to --bearing--; |
| | Line 20, | after "rough", change "surface" to --surfaces--; |
| | Line 42, | before "drive", change "from" to --front--; |
| | Line 42, | after "drive", change "axile" to --axle--; |
| | Line 48, | after "joint", change "breaks" to --break--; |
| | Line 52, | before "grease" (the first occurrence), change "tom" to --torn--; |
| Column 7, | Line 3, | after "bearing", change "become" to --becomes--; |
| | Line 4, | after "lubrication", insert --,--; |
| | Line 4, | after "to", change "power" to --powder--; |

UNITED STATES PATENT AND TRADEMARK OFFICE

CERTIFICATE OF CORRECTION

PATENT NO. : 5,586,187

DATED : Dec. 17, 1996

INVENTOR(S) : James D. Webb

It is certified that error appears in the above-indentified patent and that said Letters Patent is hereby corrected as shown below:

Line 7, after "usually", change "fills" to --falls--;

Line 46, before "squeal", change "low" to --high pitch--;

Line 47 - 48, between "at" and "speeds", insert --slow--;

Line 57, between "slight" and "in", insert --squeak--;

Line 10, after "light", change "breaking" to --braking--;

Line 15, before "indicator", change "wars" to --wear--;

Line 18, before "checked", insert --be--;

Line 22, before "reused", change "ne" to --be--;

Line 28, between "calipers" and "wheel", insert --/--;

Line 36, between "pad" and "lining", delete "." and insert --/--.

Line 40, after "detaching", delete "form";

UNITED STATES PATENT AND TRADEMARK OFFICE

CERTIFICATE OF CORRECTION

PATENT NO. : 5,586,187

DATED : Dec. 17, 1996

INVENTOR(S) : James D. Webb

It is certified that error appears in the above-indentified patent and that said Letters Patent is hereby corrected as shown below:

| | | |
|---|---|---|
| Column 9, | Line 14, | after " Rippled", change "tire" to --tires--; |
| | Line 15, | before "your", change "rob" to --rub--; |
| | Line 19, | before "cause", change "This" (the first occurrence) to --The--; |
| | Line 19, | after "improper", change "from" to --front--; |
| | Line 22, | before "tires", change "tippled" to --rippled--; |
| | Line 23, | before "axle", change "from" to --front--; |
| | Line 30, | before "causing", combine "there" and "fore" to --therefore--; |
| | Line 38, | after "and", change "addressable" to --addressed--: |

UNITED STATES PATENT AND TRADEMARK OFFICE

CERTIFICATE OF CORRECTION

PATENT NO. : 5,586,187
DATED : Dec. 17, 1996
INVENTOR(S) : James D. Webb

It is certified that error appears in the above-indentified patent and that said Letters Patent is hereby corrected as shown below:

IN THE CLAIMS

| | | |
|---|---|---|
| Column 11, | Line 34, | before "said", delete "each of" (the second occurrence); |
| Column 12, | Line 17, | before "one", change "eigth" to --eighth--; |
| | Line 42, | between "signal" and "said", insert --,--: |

UNITED STATES PATENT AND TRADEMARK OFFICE
CERTIFICATE OF CORRECTION

PATENT NO. : 5,586,187
DATED : Dec. 17, 1996
INVENTOR(S) : James D. Webb

It is certified that error appears in the above-indentified patent and that said Letters Patent is hereby corrected as shown below: IN THE DRAWING Sheet 1 of 2 (FIG.1), after "Squeak", in the item 2, change "Breaks" to --Brakes--, and after "Squeal", change "Breaks" to --Brakes--:

Signed and Sealed this

Twenty-fourth Day of June, 1997

Attest:

BRUCE LEHMAN

*Attesting Officer* *Commissioner of Patents and Trademarks*